(12) United States Patent
Baik et al.

(10) Patent No.: US 7,190,575 B1
(45) Date of Patent: Mar. 13, 2007

(54) HARD DISK DRIVE SYSTEM AND KEYING METHOD

(75) Inventors: David Baik, Sunnyvale, CA (US); George Feltovich, San Jose, CA (US); Brad Reger, Dublin, CA (US); David Willheim, Los Gatos, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 26 days.

(21) Appl. No.: 11/195,465

(22) Filed: Aug. 2, 2005

(51) Int. Cl.
*G06F 1/16* (2006.01)

(52) U.S. Cl. .................. 361/685; 248/682; 360/97.03; 312/223.1

(58) Field of Classification Search ................ 414/280; 248/56, 682; 312/223.1–223.2; 360/97.03; 361/679–687, 724–727
See application file for complete search history.

(56) References Cited

U.S. PATENT DOCUMENTS

| | | | |
|---|---|---|---|
| 5,588,728 A | 12/1996 | Eldridge et al. ......... 312/332.1 |
| 5,691,879 A | 11/1997 | Lopez et al. ................. 361/685 |
| 6,249,432 B1 * | 6/2001 | Gamble et al. ............. 361/685 |
| 6,431,718 B1 | 8/2002 | Gamble et al. ............... 362/85 |
| 6,487,081 B2 | 11/2002 | Homer et al. ................ 361/730 |
| 6,580,604 B1 * | 6/2003 | McAnally et al. .......... 361/685 |
| 6,819,555 B2 | 11/2004 | Bolognia et al. ........... 361/685 |
| 2005/0052841 A1 * | 3/2005 | Chen et al. .................. 361/685 |
| 2005/0237707 A1 * | 10/2005 | Connelly et al. ........... 361/685 |

\* cited by examiner

*Primary Examiner*—Hung Van Duong
(74) *Attorney, Agent, or Firm*—Suiter Swantz pc llo

(57) ABSTRACT

A hard disk drive system includes a plurality of hard disk drive carriers and a hard disk drive chassis. Each of the plurality of hard disk drive carriers has a body and an ejector rotatably connected to the body. The ejector includes a first alignment member on a first side of the ejector and a second alignment member on a second side of the ejector. The second side of the ejector is opposite the first side of the ejector. The hard disk drive chassis includes a plurality of receiving slots for receiving the plurality of hard disk drive carriers. Two of the plurality of hard disk drive carriers may be fully inserted, next to each other, into the plurality of receiving slots.

21 Claims, 7 Drawing Sheets

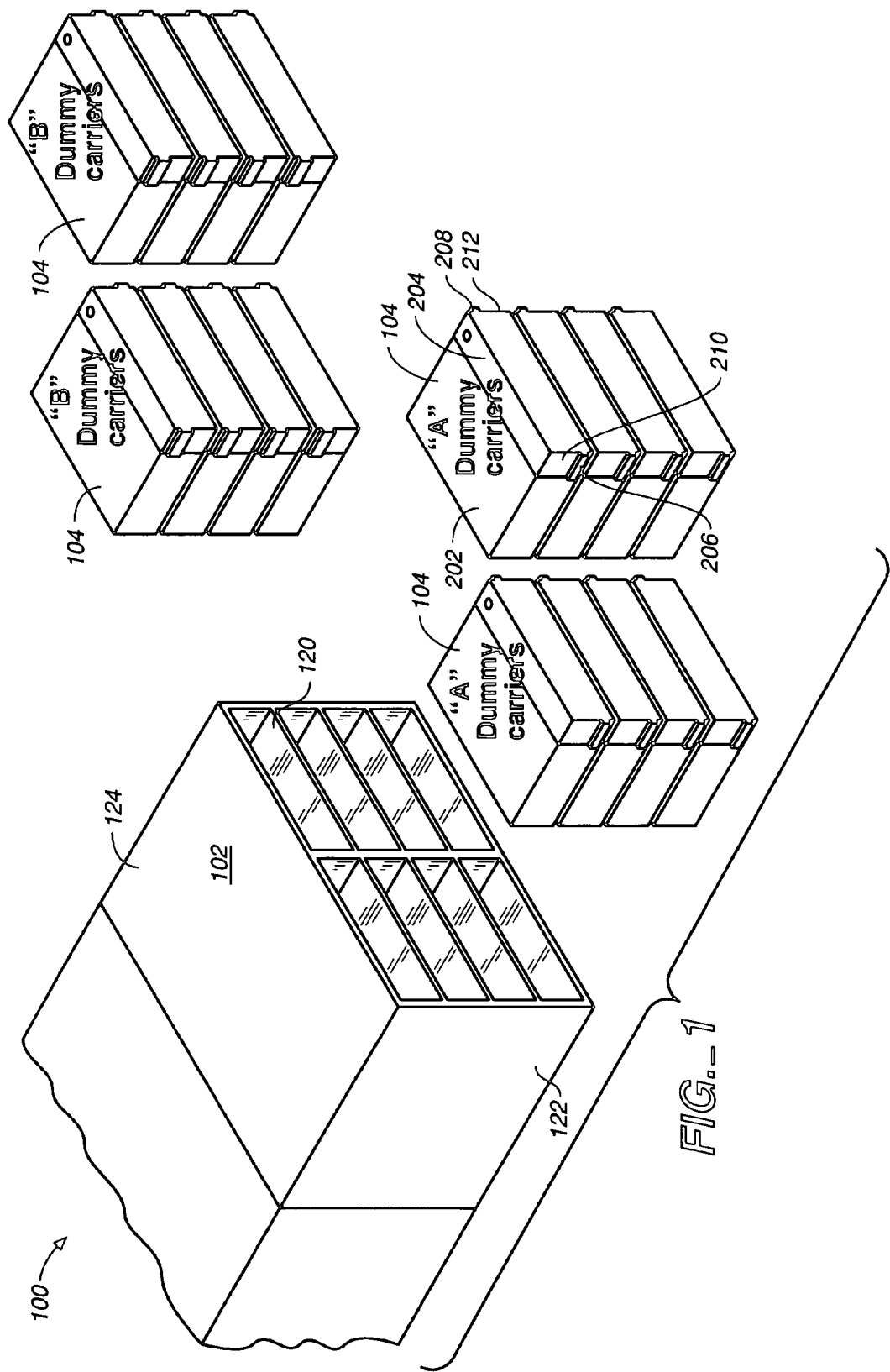
FIG._1

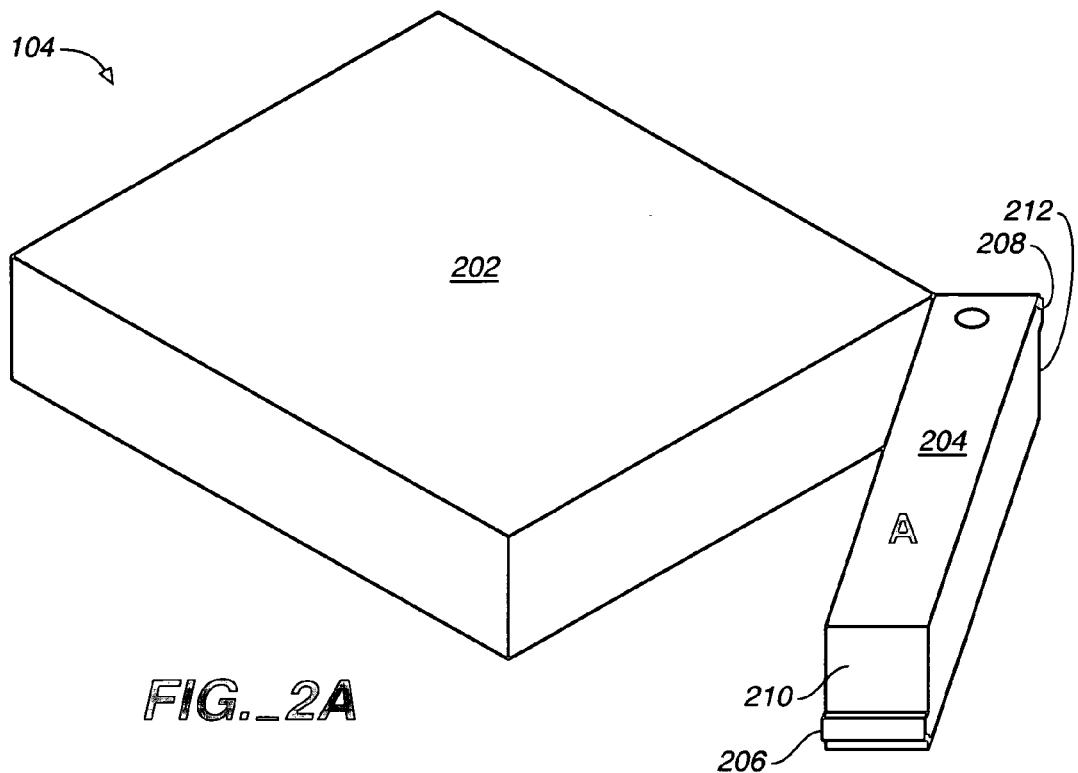
FIG._2A
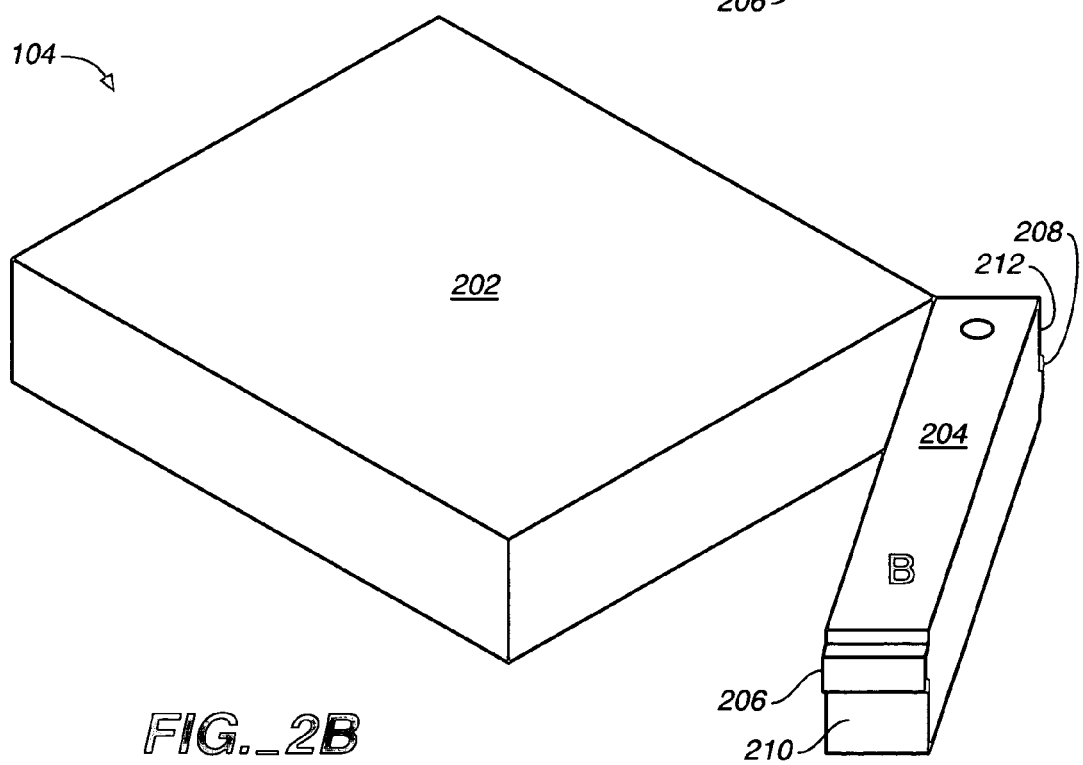
FIG._2B

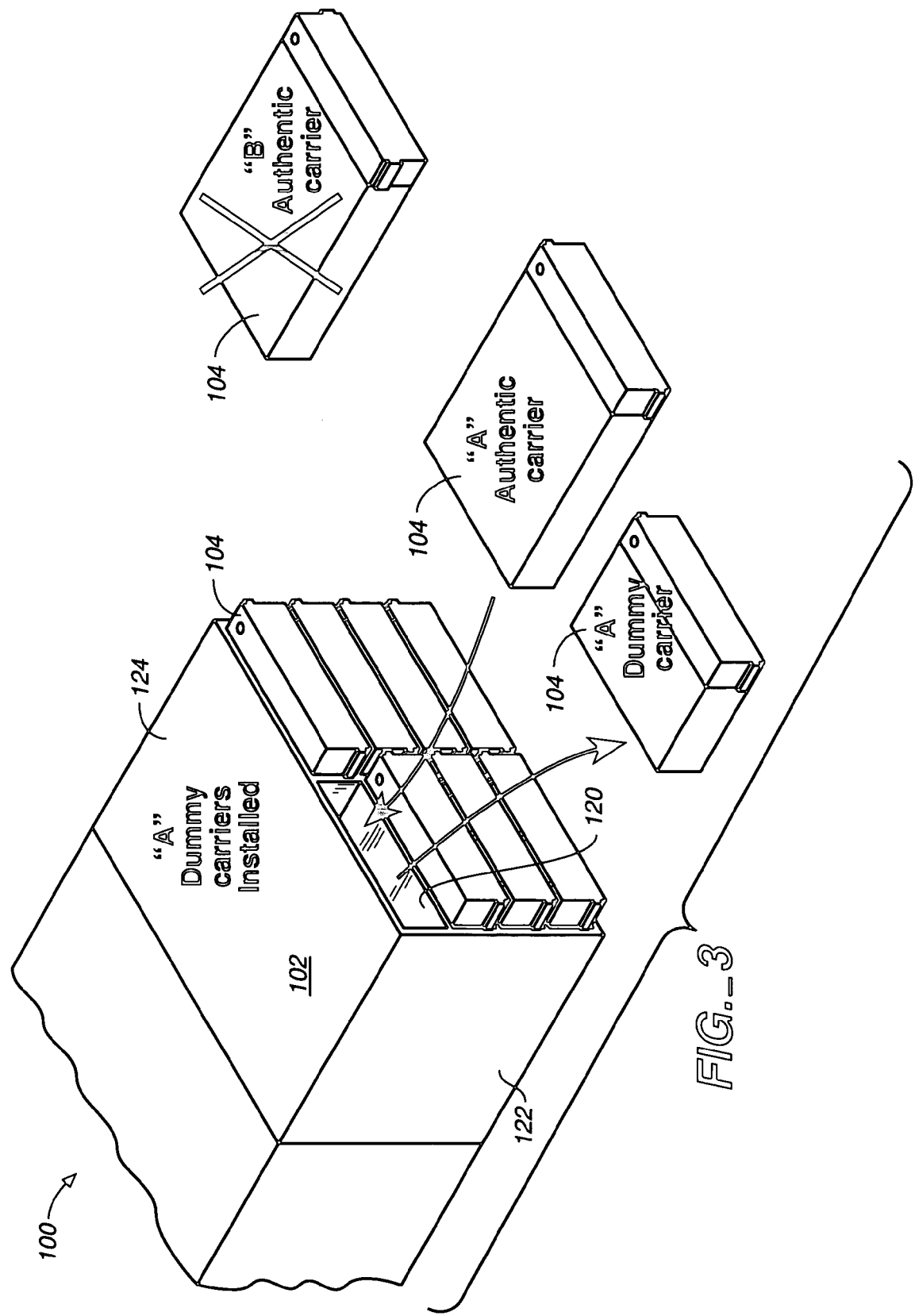

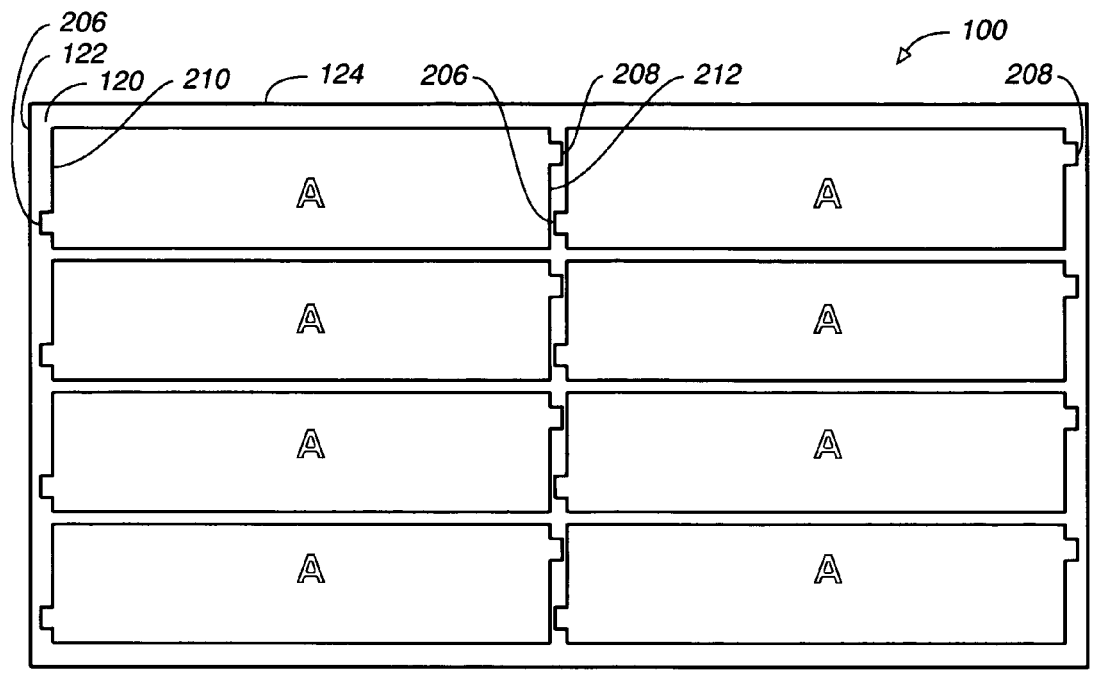
FIG._4A
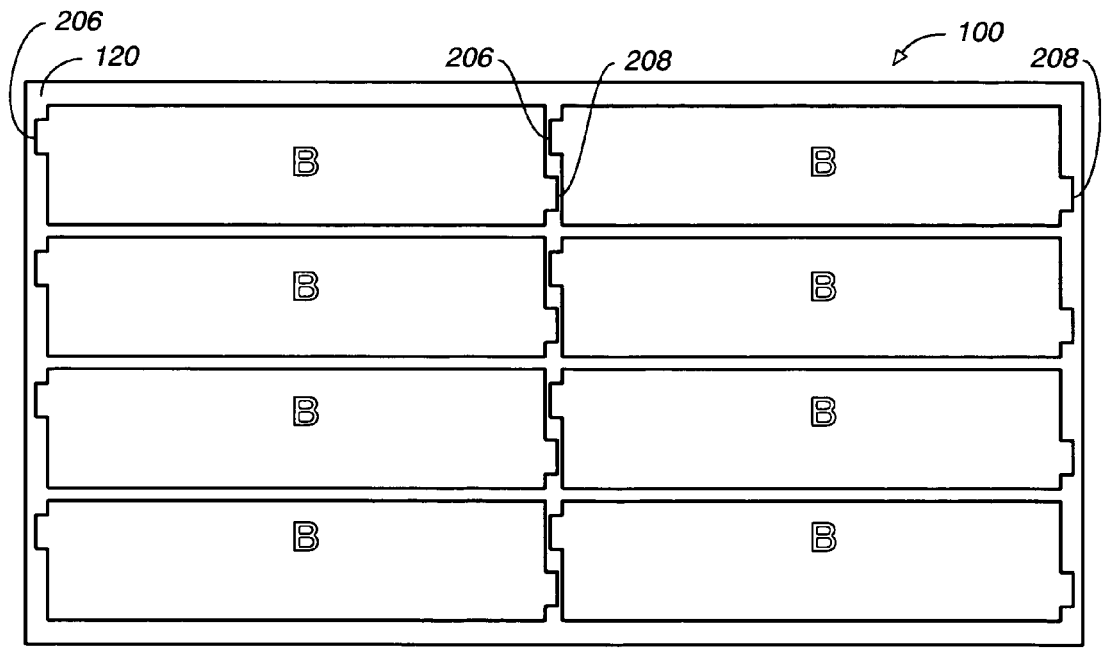
FIG._4B

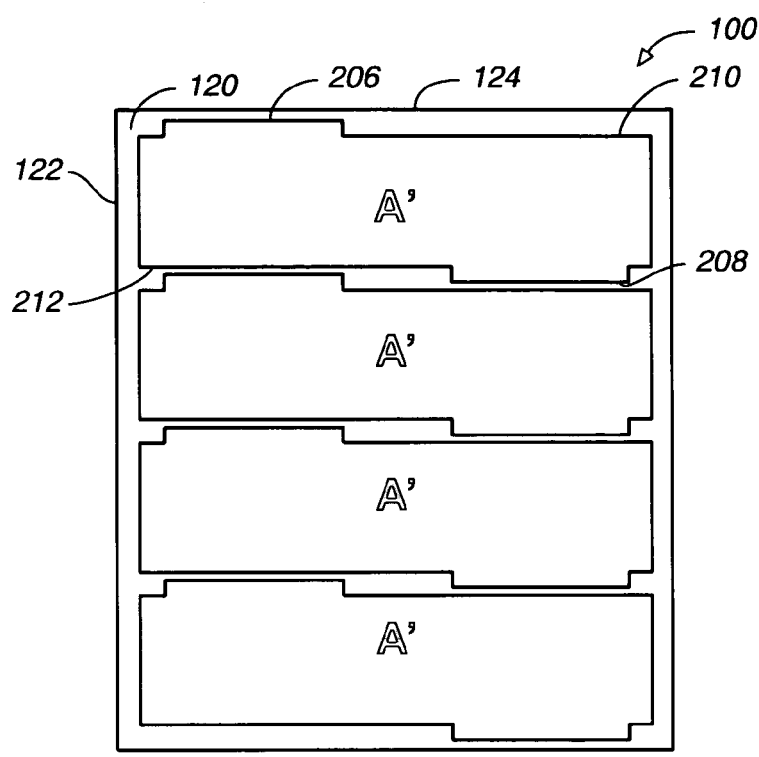
FIG._5A
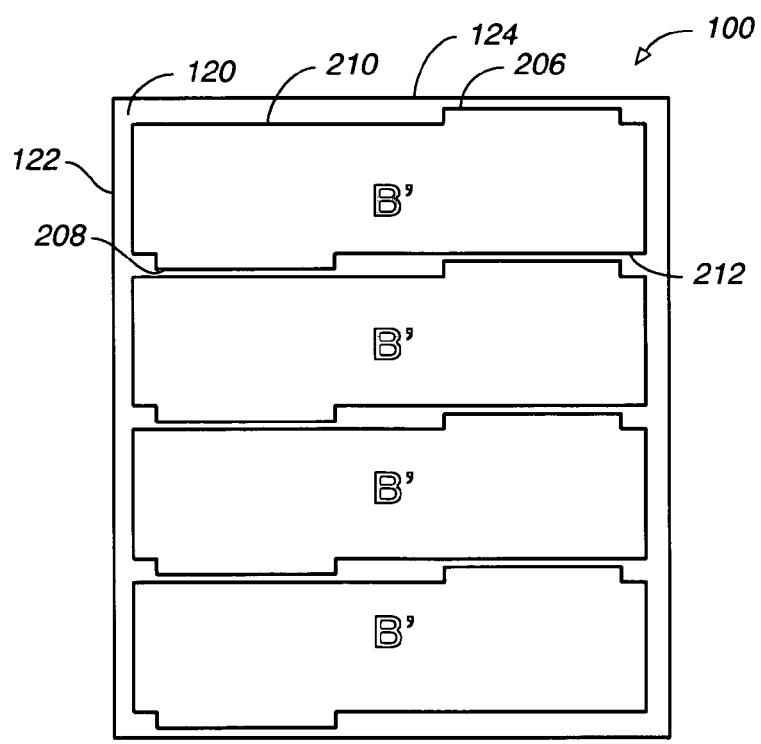
FIG._5B

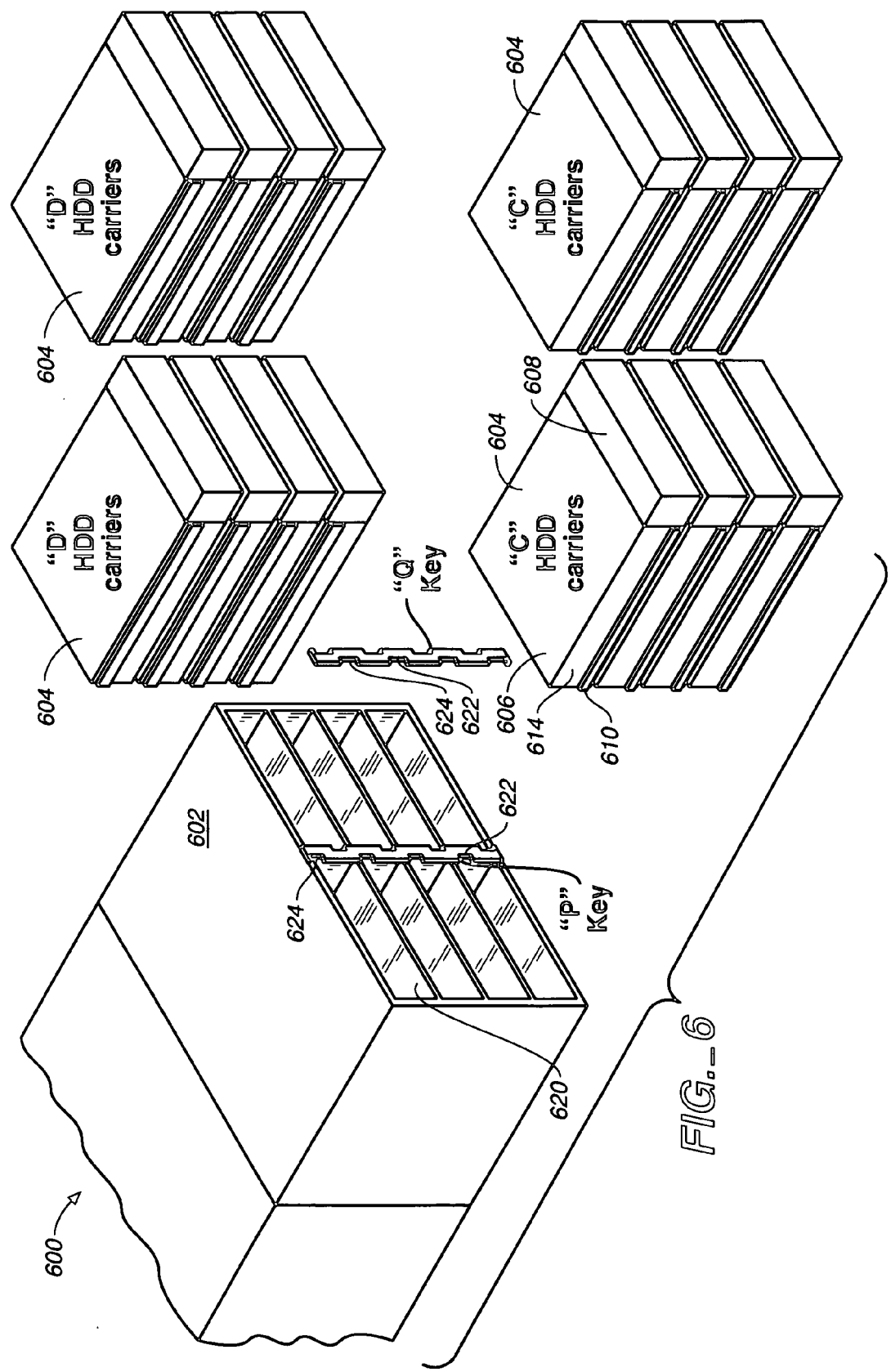
FIG._6

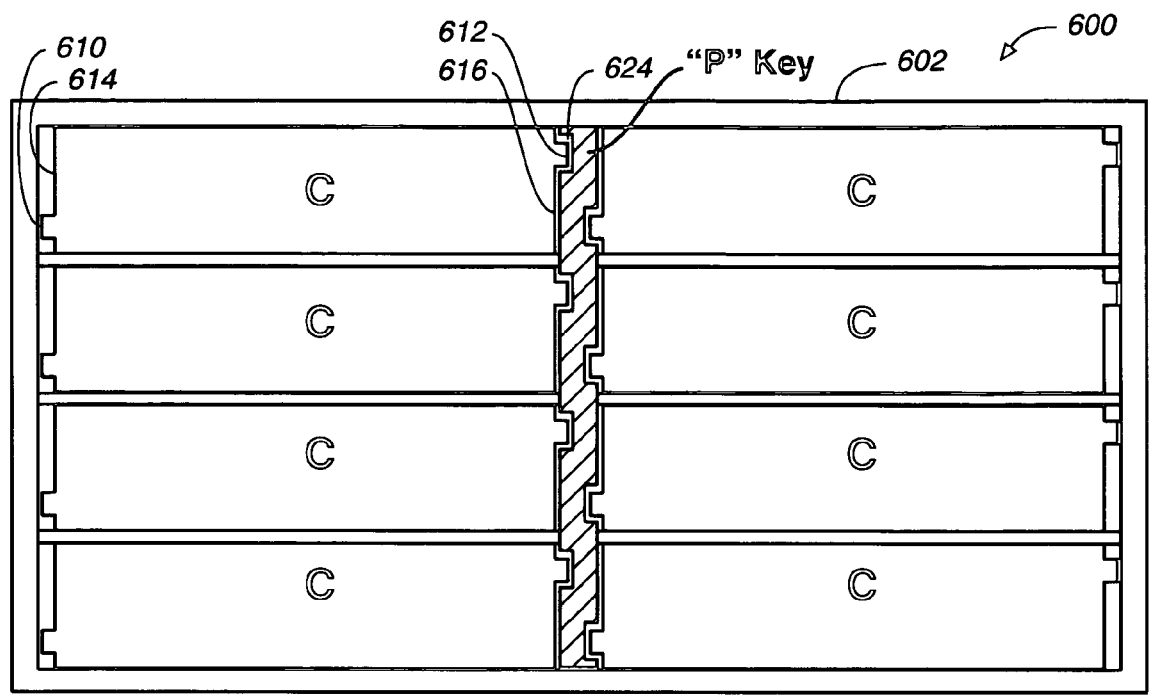
FIG._7A
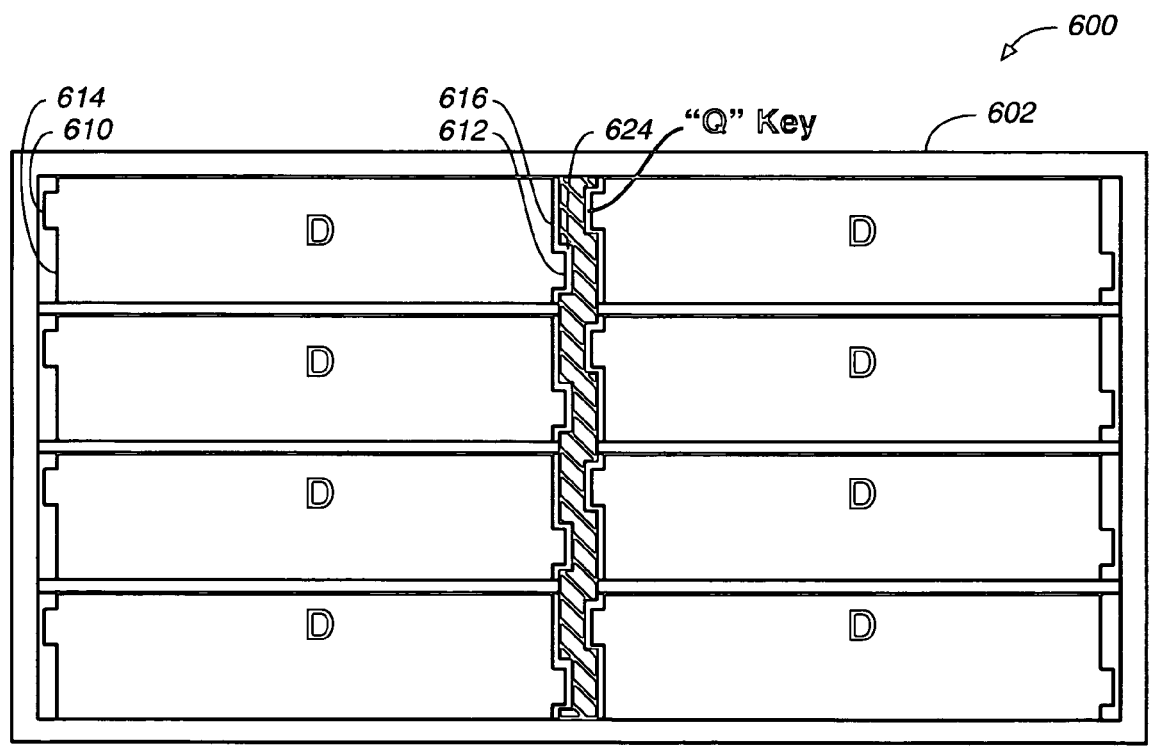
FIG._7B

HARD DISK DRIVE SYSTEM AND KEYING METHOD

FIELD OF THE INVENTION

This invention relates generally to hard disk drives, and particularly to a hard disk drive (HDD) system and keying method.

BACKGROUND OF THE INVENTION

Hard disk drive (HDDs) for a file server or other type of computer are often mounted, in a vertically or horizontally stacked array, in a rectangular sheet metal "cage" structure which may be disposed within the computer housing or externally thereto. For operational convenience and flexibility, each disk drive is typically "hot plug" connected within the cage. This type of electrical connection permits any of the supported disk drives to be removed and re-installed within the cage without disturbing the operation of the other disk drives.

To effect this desirable hot plug connection of each of the disk drives, each disk drive is typically supported on a carrier structure which is slidably and removably insertable into the cage to mate an electrical connector carried on a rear portion of the drive or its carrier structure with a corresponding electrical connector on a back plane circuit board suitably supported at the rear interior side of the cage.

There are various types of HHDs such as SATA (Serial Advanced Technology Attachment) HHDs, PATA (Parallel Advanced Technology Attachment) HHDs, SAS (Serial Attached SCSI) HHDs, FC (Fibre Channel) HDDs, and the like. An increasing problem associated with the carrier support of disk drives removably mounted in cage structures or the like is a mixed mode operation (e.g., when a FC HDD is improperly placed into a receiving slot of a chassis where a SATA/SAS HDD should have been placed) which may cause HDD read/write timing problems, data corruption, and/or data loss.

Thus, it would be desirable to provide a hard disk drive (HDD) system and keying method, which may prevent a mixed-mode operation of HDDs.

SUMMARY OF THE INVENTION

In an exemplary aspect of the present invention, a hard disk drive system includes a plurality of hard disk drive carriers and a hard disk drive chassis. Each of the plurality of hard disk drive carriers has a body and an ejector rotatably connected to the body. The ejector includes a first alignment member on a first side of the ejector and a second alignment member on a second side of the ejector. The second side of the ejector is opposite the first side of the ejector. The hard disk drive chassis includes a plurality of receiving slots for receiving the plurality of hard disk drive carriers. Two of the plurality of hard disk drive carriers may be fully inserted, next to each other, into the plurality of receiving slots.

In an additional exemplary aspect of the present invention, a hard disk drive system includes a hard disk drive carrier and a hard disk drive chassis. The hard disk drive carrier has a body and an ejector rotatably connected to the body. The body includes a first alignment member on a first side of the body and a second alignment member on a second side of the body. The first alignment member protrudes from the first side of the body, and the second alignment member protrudes from the second side of the body. The second side of the body is opposite the first side of the body. The hard disk drive chassis includes at least one receiving slot for receiving the hard disk drive carrier. The hard disk drive chassis has a key member coupled to at least one outside wall of the hard disk drive chassis. The key member is suitable for enabling the hard disk drive carrier to be fully inserted into the at least one receiving slot of the hard disk drive chassis.

In another exemplary aspect of the present invention, a hard disk drive keying method includes the following steps. A plurality of hard disk drive carriers is provided. Each of the plurality of hard disk drive carriers includes a body and an ejector rotatably connected to the body. Each of the plurality of hard disk drive carriers has a first alignment member and a second alignment member on its body or its ejector. A hard disk drive chassis is provided. The hard disk drive chassis includes at least one receiving slot for receiving at least one of the plurality of hard disk drive carriers. One of the plurality of hard disk drive carriers is inserted into the at least one receiving slot.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic diagram illustrating a HDD system including a plurality of HDD carriers in accordance with an exemplary embodiment of the present invention;

FIGS. 2A and 2B illustrate a type "A" carrier and a type "B" carrier, respectively, in accordance with an exemplary embodiment of the present invention;

FIG. 3 is a schematic diagram illustrating the HDD system shown in FIG. 1, where an authentic carrier is to be inserted into a receiving slot in place of a dummy carrier of the same type in accordance with an additional exemplary embodiment of the present invention;

FIG. 4A is a front view of the HDD system shown in FIG. 1, where "A" type carriers are fully inserted into the receiving slots;

FIG. 4B is a front view of the HDD system shown in FIG. 1, where "B" type carriers are fully inserted into the receiving slots;

FIG. 5A is a front view of the HDD system shown in FIG. 1, where "A" type carriers are fully inserted into the receiving slots;

FIG. 5B is a front view of the HDD system shown in FIG. 1, where "B" type carriers are fully inserted into the receiving slots;

FIG. 6 is a schematic diagram illustrating a HDD system in accordance with another exemplary embodiment of the present invention;

FIG. 7A is a front view of the HDD system shown in FIG. 6, where "C" type carriers are fully inserted into receiving slots; and FIG. 7B is a front view of a HDD system shown in FIG. 6, where "D" type carriers are fully inserted into receiving slots.

DETAILED DESCRIPTION OF THE INVENTION

Reference will now be made in detail to the presently preferred embodiments of the invention, examples of which are illustrated in the accompanying drawings.

The present invention uses mechanical keying devices to prevent mixed-mode operations such as mixing of different drive types (SATA/PATA, FC, SAS, and the like). Keying may be implemented in either horizontal or vertical HDD dividers. Additionally, different color may be used to distinguish different drive types.

Referring generally to FIGS. 1 through 5, an exemplary HDD system 100 is shown. The HDD system 100 may include a HDD chassis (or chassis) 102 and a plurality of HDD carriers (or carriers) 104 (see, e.g., FIGS. 1 and 3). Each of the plurality of carriers 104 has a body 202 and an ejector 204 rotatably connected to the body 202 (see, e.g., FIGS. 2A and 2B). The ejector 204 includes a first alignment member 206 on a first side 210 of the ejector 204 and a second alignment member 208 on a second side 212 of the ejector 204. The second side 212 of the ejector 204 is opposite the first side 210 of the ejector 204. Depending on the relative positions of the first alignment member 206 and the second alignment member 208 on the ejector 204, the carrier 104 may be divided into different types. For example, FIG. 2A shows an "A" type carrier and FIG. 2B shows a "B" type carrier. Each type of HDD carrier may include two categories: an authentic carrier and a dummy carrier. An authentic carrier is a real-life, workable carrier which includes a workable HDD (see, e.g., FIG. 3). For example, an authentic "A" type carrier may be a FC HDD carrier, and an authentic "B" type carrier may be a SATA/SAS HDD carrier, or vice vesa. In contrast, a dummy carrier does not include a real-life, workable HDD (see, e.g., FIGS. 1 and 3). It is understood that each of the alignment members 206, 208 may be a single protrusion or may include a plurality of discrete protrusions without departing from the scope and spirit of the present invention.

The chassis 102 includes a plurality of receiving slots 120 for receiving the plurality of carriers 104. The chassis 102 has a first outer wall 122 and a second outer wall 124. The second outer wall 124 is at least substantially perpendicular to the first outer wall 122. The first side 210 of the ejector 204 and the second side 212 of the ejector may be at least substantially parallel to the first outer wall 122 of the hard disk drive chassis 102. In order to prevent the mixed-mode operation, the alignment members 206, 208 of the carrier 104 may be built so that only the same type of carriers 104 may be fully inserted, next to each other (either horizontally or vertically), into the plurality of receiving slots 120. This is shown in FIG. 3, where a plurality of "A" type dummy carriers 104 are fully inserted into the receiving slots 120. Only an "A" type authentic carrier 104 may be inserted into the receiving slot 120 to replace an "A" type dummy carrier 104. A "B" type authentic carrier 104 may not be fully inserted into the receiving slot 102 next to an "A" type carrier because of interference of their respective alignment member. This is better illustrated in FIG. 4A, where "A" type carriers are shown to be fully inserted into the receiving slots 120 next to each other horizontally, and FIG. 4B, "B" type carriers are shown to be fully inserted into the receiving slots 120 next to each other horizontally. Since the alignment members 206, 208 do not interfere with each other, the same type of carriers may be fully inserted into the receiving slots 120 next to each other horizontally. However, if a user desires to fully insert a "B" type carrier into the receiving slot 120 horizontally next to an "A" type carrier, because of the interference between the alignment members, the user may not be able to do that. Thus, the present invention may prevent the mixed-mode operation. FIGS. 5A and 5B show alternative embodiments of the alignment members 206, 208, where the first side 210 of the ejector 204 and the second side 212 of the ejector are at least substantially parallel to the second outer wall 124 of the hard disk drive chassis 102. For these embodiments, different types of carriers 104 may not be fully inserted vertically, next to each other, into the plurality of receiving slots 120.

Referring now to FIGS. 6, 7A and 7B, an exemplary HDD system 600 is shown. The HDD system 600 includes a hard disk drive chassis (or chassis) 602 and a hard disk drive carrier (or carrier) 604. The hard disk drive carrier 604 has a body 606 and an ejector 608 rotatably connected to the body 606. The body 606 includes a first alignment member 610 on a first side 614 of the body 606 and a second alignment member 612 on a second side 616 of the body 606. The first alignment member 610 protrudes from the first side 614 of the body 606, and the second alignment member 612 protrudes from the second side 616 of the body 606. The second side 616 of the body 606 is opposite the first side 614 of the body 606. Depending on the relative positions of the first alignment member 610 and the second alignment member 612 on the ejector 608, the carrier 604 may be divided into different types. For example, FIG. 7A shows an "C" type carrier and FIG. 7B shows a "D" type carrier. Each type of HDD carrier may include two categories: an authentic carrier and a dummy carrier. An authentic carrier is a real-life, workable carrier which includes a workable HDD. For example, an authentic "C" type carrier may be a FC HDD carrier, and an authentic "D" type carrier may be a SATA/SAS HDD carrier, or vice vesa. In contrast, a dummy carrier does not include a real-life, workable HDD. It is understood that each of the alignment members 610, 612 may be a single protrusion or may include a plurality of discrete protrusions without departing from the scope and spirit of the present invention.

The hard disk drive chassis 602 includes at least one receiving slot 620 for receiving the hard disk drive carrier 604. The hard disk drive chassis 602 has a key member 622 coupled to at least one outside wall of the hard disk drive chassis 602. The key member 622 is suitable for enabling the hard disk drive carrier 604 to be fully inserted into the at least one receiving slot 620 of the hard disk drive chassis 602. The key member 622 includes at least one slot 624 for receiving at least one of the first alignment member 610 and the second alignment member 612 so that the hard disk drive carrier 604 may be fully inserted into the at least one receiving slot 620 of the hard disk drive chassis 602. In other words, a specific type of carrier 604 has a matching key member 622 whose slots 624 are suitable for receiving the corresponding alignment members 610, 612. For example, the chassis 602 with a "P" type key member 622 can only receive matching "C" type carriers 604 (see, e.g., FIG. 7A), and the chassis 602 with a "Q" type key member 622 can only receive matching "D" type carriers 604 (see, e.g., FIG. 7B). Thus, when a user desires to use the chassis 602 to host FC HDD carriers, the user may install a matching key member 622 on the chassis 602 to prevent SATA/SAS HDD carriers (which do not match the key member 622) from being installed. On the other hand, when a user desires to use the chassis 602 to host SATA/SAS HDD carriers, the user may install a matching key member 622 on the chassis 602 to prevent FC carriers (which do not match the key member 622) from being installed.

Those of ordinary skill in the art will understand that the foregoing-described systems 100 and 600 may work together without departing from the scope and spirit of the present invention.

The present invention may have the following advantages. First, it may provide manufacturing flexibility. It uses the same chassis, but with specified keying in the chassis front, to deploy PATA/SATA, SAS, and FC drives, thereby providing maximum flexibility. Moreover, the present invention may prevent one, skilled or not skilled in the art, from installing incorrect HDDs into an established set of HDDs. Additionally, it may increase uptime and provide easy identification of incorrect device. Further, it may prevent possible data corruption or loss caused by the mixed-mode operation (a mixed-mode operation may cause the devices not to function or malfunction, and the malfunctioned devices may lead to data corruption).

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A hard disk drive system, comprising:
   a plurality of hard disk drive carriers, each of said plurality of hard disk drive carriers including a body and an ejector rotatably connected to said body, said ejector including a first alignment member on a first side of said ejector and a second alignment member on a second side of said ejector, said second side of said ejector being opposite said first side of said ejector; and
   a hard disk drive chassis including a plurality of receiving slots for receiving said plurality of hard disk drive carriers, said hard disk drive chassis including a first outer wall and a second outer wall, said second outer wall being at least substantially perpendicular to said first outer wall,
   wherein two of said plurality of hard disk drive carriers may be fully inserted, next to each other, into said plurality of receiving slots.

2. The hard disk drive system of claim 1, wherein said plurality of hard disk drive carries is selected from a group consisting of dummy carriers or authentic carriers.

3. The hard disk drive system of claim 1, wherein said first side of said ejector and said second side of said ejector are at least substantially parallel to said first outer wall of said hard disk drive chassis.

4. The hard disk drive system of claim 1, wherein said first side of said ejector and said second side of said ejector are at least substantially parallel to said second outer wall of said hard disk drive chassis.

5. The hard disk drive system of claim 1, wherein said first alignment member protrudes from said first side of said ejector, and said second alignment member protrudes from said second side of said ejector.

6. The hard disk drive system of claim 2, wherein said authentic carriers are Fibre Channel carriers or SATA/SAS carriers.

7. The hard disk drive system of claim 5, wherein when said two of said plurality of hard disk drive carriers are fully inserted, next to each other, into said plurality of receiving slots, first alignment members and second alignment members of said two of said plurality of hard disk drive carriers do not interfere with each other.

8. The hard disk drive system of claim 5, wherein said plurality of hard disk drive carriers includes a first type of hard disk drive carriers and a second type of hard disk drives, and when one of said first type of hard disk drive carriers and one of said second type of hard disk drive carriers are placed next to each other, at least one of a first alignment member or a second alignment member of said one of said first type of hard disk drive carriers interferes with at least one of a first alignment member or a second alignment member of said one of said second type of hard disk drive carriers so that said one of said first type of hard disk drive carriers and said one of said second type of hard disk drive carriers cannot be fully inserted, next to each other, into said plurality of receiving slots.

9. A hard disk drive system, comprising:
   a hard disk drive carrier including a body and an ejector rotatably connected to said body, said body including a first alignment member on a first side of said body and a second alignment member on a second side of said body, said first alignment member protruding from said first side of said body, said second alignment member protruding from said second side of said body, said second side of said body being opposite said first side of said body; and
   a hard disk drive chassis including at least one receiving slot for receiving said hard disk drive carrier, said hard disk drive chassis including a key member coupled to at least one outside wall of said hard disk drive chassis, said key member being suitable for enabling said hard disk drive carrier to be fully inserted into said at least one receiving slot of said hard disk drive chassis.

10. The hard disk drive system of claim 9, wherein said key member includes at least one slot for receiving at least one of said first alignment member or said second alignment member so that said hard disk drive carrier may be fully inserted into said at least one receiving slot of said hard disk drive chassis.

11. The hard disk drive system of claim 9, wherein said hard disk drive carrier is an authentic carrier.

12. The hard disk drive system of claim 9, further comprises a second hard disk drive carrier, wherein said key member prevents said second hard disk drive carrier from being fully inserted into said at least one receiving slot of said hard disk drive chassis, said second hard disk drive carrier being a different type from said hard disk drive carrier.

13. The hard disk drive system of claim 9, further comprises a second hard disk drive carrier, wherein said key member enables said second hard disk drive carrier to be fully inserted into said at least one receiving slot of said hard disk drive chassis, said second hard disk drive carrier being a same type as said hard disk drive carrier.

14. The hard disk drive system of claim 11, wherein said authentic carrier is a Fibre Channel carrier or a SATA/SAS carrier.

15. The hard disk drive system of claim 12, wherein said second hard disk drive carrier is an authentic carrier.

16. The hard disk drive system of claim 15, wherein said authentic carrier is a Fibre Channel carrier or a SATA/SAS carrier.

17. A hard disk drive keying method, comprising:
providing a plurality of hard disk drive carriers, each of said plurality of hard disk drive carriers including a body and an ejector rotatably connected to said body, said each of said plurality of hard disk drive carriers including a first alignment member and a second alignment member on its body or its ejector;
providing a hard disk drive chassis including at least one receiving slot for receiving at least one of said plurality of hard disk drive carriers; and
inserting one of said plurality of hard disk drive carriers into said at least one receiving slot.

18. The hard disk drive keying method of claim 17, further comprises inserting a second of said plurality of hard disk drive carriers into said at least one receiving slot, said one of said plurality of hard disk drive carriers and said second of said plurality of hard disk drive carriers being next to each other, alignment members of said second of said plurality of hard disk drive carriers being not interfering with alignment members of said one of said plurality of hard disk drive carriers.

19. The hard disk drive keying method of claim 18, wherein said plurality of hard disk drive carries is selected from a group consisting of dummy carriers or authentic carriers.

20. The hard disk drive keying method of claim 19, wherein said authentic carriers are Fibre Channel carriers or SATA/SAS carriers.

21. A hard disk drive system, comprising:
a plurality of hard disk drive carriers, each of said plurality of hard disk drive carriers including a body and an ejector rotatably connected to said body, said ejector including a first alignment member on a first side of said ejector and a second alignment member on a second side of said ejector, said second side of said ejector being opposite said first side of said ejector; and
a hard disk drive chassis including a plurality of receiving slots for receiving said plurality of hard disk drive carriers,
wherein two of said plurality of hard disk drive carriers may be fully inserted, next to each other, into said plurality of receiving slots.

* * * * *